United States Patent
Ikeda et al.

(10) Patent No.: US 6,969,623 B1
(45) Date of Patent: Nov. 29, 2005

(54) SEMICONDUCTOR DEVICE AND METHOD FOR MANUFACTURING THE SAME

(75) Inventors: Kouichi Ikeda, Jouetsu (JP); Takeshi Ikeda, Jouetsu (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 600 days.

(21) Appl. No.: 09/716,843

(22) Filed: Nov. 17, 2000

Related U.S. Application Data

(63) Continuation of application No. PCT/JP99/02564, filed on May 18, 1999.

(30) Foreign Application Priority Data

May 19, 1998 (JP) .................................. 10-153818
May 19, 1998 (JP) .................................. 10-153819

(51) Int. Cl.[7] .......................... H01L 31/26; H01L 21/44
(52) U.S. Cl. ........................................ 438/15; 438/113
(58) Field of Search ................... 438/14, 15, 106–114; 257/686

(56) References Cited

U.S. PATENT DOCUMENTS

| | | | |
|---|---|---|---|
| 5,497,381 A | * | 3/1996 | O'Donoghue et al. ...... 714/736 |
| 5,504,369 A | * | 4/1996 | Dasse et al. ................... 257/48 |
| 5,786,237 A | * | 7/1998 | Cockerill et al. ........... 438/109 |

* cited by examiner

*Primary Examiner*—Brook Kebede
(74) *Attorney, Agent, or Firm*—Dellett & Walters

(57) ABSTRACT

A semiconductor device and a method for manufacturing the semiconductor device mountable with high density, which includes a simplified process but is capable of reducing a defect rate. A plurality of identical memory chips are formed on a semiconductor wafer, and a go/no-go test is conducted on all the memory chips. The semiconductor wafer is cut and divided into pieces that each consists of one, or two, or four good memory chips, and they are mounted on a substrate to form a memory module.

4 Claims, 5 Drawing Sheets

SEMICONDUCTOR DEVICE AND METHOD FOR MANUFACTURING THE SAME

TECHNICAL FIELD

The invention relates to a semiconductor device mounted on a memory substrate, a mother board, or the like and a method for manufacturing the same.

BACKGROUND ART

A semiconductor chip such as a memory chip cutout from a semiconductor wafer is generally mounted on a printed substrate or the like in a packaging condition. However, an outer size of a package is considerably larger than the size of a various types of the semiconductor chips themselves and therefore, there is a certain limit in the number of the packages mountable on the printed substrate or the like.

On the other hand, recently, a multichip module (MCM), in which a plurality of semiconductor chips are mounted on the substrate, is being popularized. Using the multichip module allows the followings: (1) miniaturization of a mounting area and weight reduction accompanying with this, (2) realization of a high performance and high speed by high density wiring and bear chip mounting, and (3) keeping high reliability.

By the way, in the multichip module capable of a high density mounting described above, a plurality of semiconductor chips are mounted on a single substrate and therefore, a defect ratio of respective semiconductor chips is accumulated to make a total defect ratio of the module large. For example, in the case where four memory chips are implemented on a single module substrate, only one defect memory chip causes overall defect of the module. Therefore, it is necessary handling to replace the defect memory chip as a repairing work and discard the overall module as a defect product. Thus, a low yield and a low efficiency occur. In addition, in the case where a plurality of semiconductor chips are mounted on a single substrate, each one of respective chips is mounted on a single substrate to complicate a manufacturing process.

DISCLOSURE OF THE INVENTION

The present invention is achieved in consideration of such points and an object thereof is to provide a semiconductor device and a method for manufacturing thereof capable of reducing a defect ratio in manufacturing the semiconductor device mountable with high density and capable of simplifying the process.

In the present invention, after a plurality of identical semiconductor chips (preferably, memory chip) are formed on the semiconductor wafer or after wiring, resin sealing, and terminal formation is carried out for these semiconductor chips, a go/no-go test (quality test) is conducted for each semiconductor chip. According to the result, a unit of one or a plurality of semiconductor chips is divided to form the semiconductor device. Dividing semiconductor chips is carried out according to the result of quality test. When the semiconductor device comprising a plurality of semiconductor chips is manufactured, some defective semiconductor chips among them does not cause defect of overall semiconductor device. Thus, the defect rate in manufacturing the semiconductor device can be reduced. Because the semiconductor device comprising a plurality of semiconductor chips can be used in a process there after and thus, in comparison with application of combination of a plurality of semiconductor devices comprising a single semiconductor chip, the process thereafter can be simplified.

Particularly, by practice of a mounting step composed of wiring, resin sealing, and terminal formation for respective semiconductor chips formed on the semiconductor wafer, in comparison with the case where the mounting step is carried out after respective semiconductor chips are individually divided more simplification of the process become possible.

It is preferable that semiconductor chips, particularly memory chips, according to the result of quality test are divided in every group made of four pieces if four is possible to handle, every two pieces if four is impossible but two are possible to handle, and every one piece if two are impossible to handle. As described above, priority of dividing in a group of a plurality of pieces makes efficient manufacture of the semiconductor device of the large (for four pieces) unit possible.

BEST MODE FOR CARRYING OUT THE INVENTION

A memory module of a first embodiment according to the present invention will be described below with reference to drawings. FIGS. 1A to 1D are diagrams showing a manufacturing process of a memory module of a first embodiment.

Figure 1A:
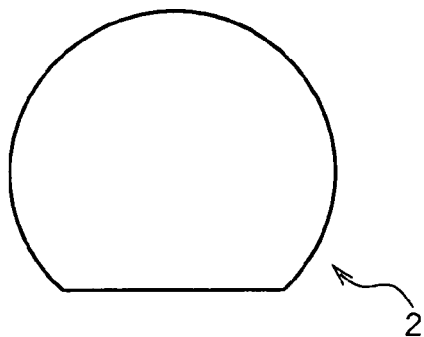
FIGS. 1A to 1D are diagrams showing a manufacturing process of a memory module of a first embodiment.
Figure 1B:
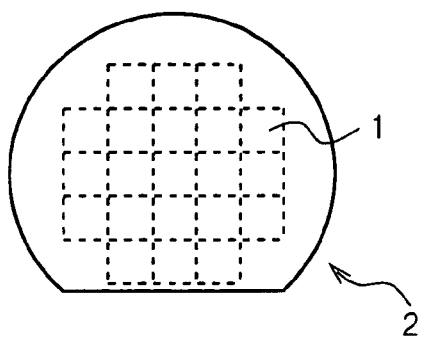

First, as shown in FIGS. 1A and 1B, a semiconductor wafer 2 which is, for example, a flake of silicon monocrystal, is introduced to form identical memory chips 1 thereon (a first step). Respective regions surrounded by a dotted line in FIG. 1B shows one unit of the memory chip 1 (the smallest unit of division) and on the semiconductor wafer 2, a plurality of the memory chips 1 are formed.

Figure 2:
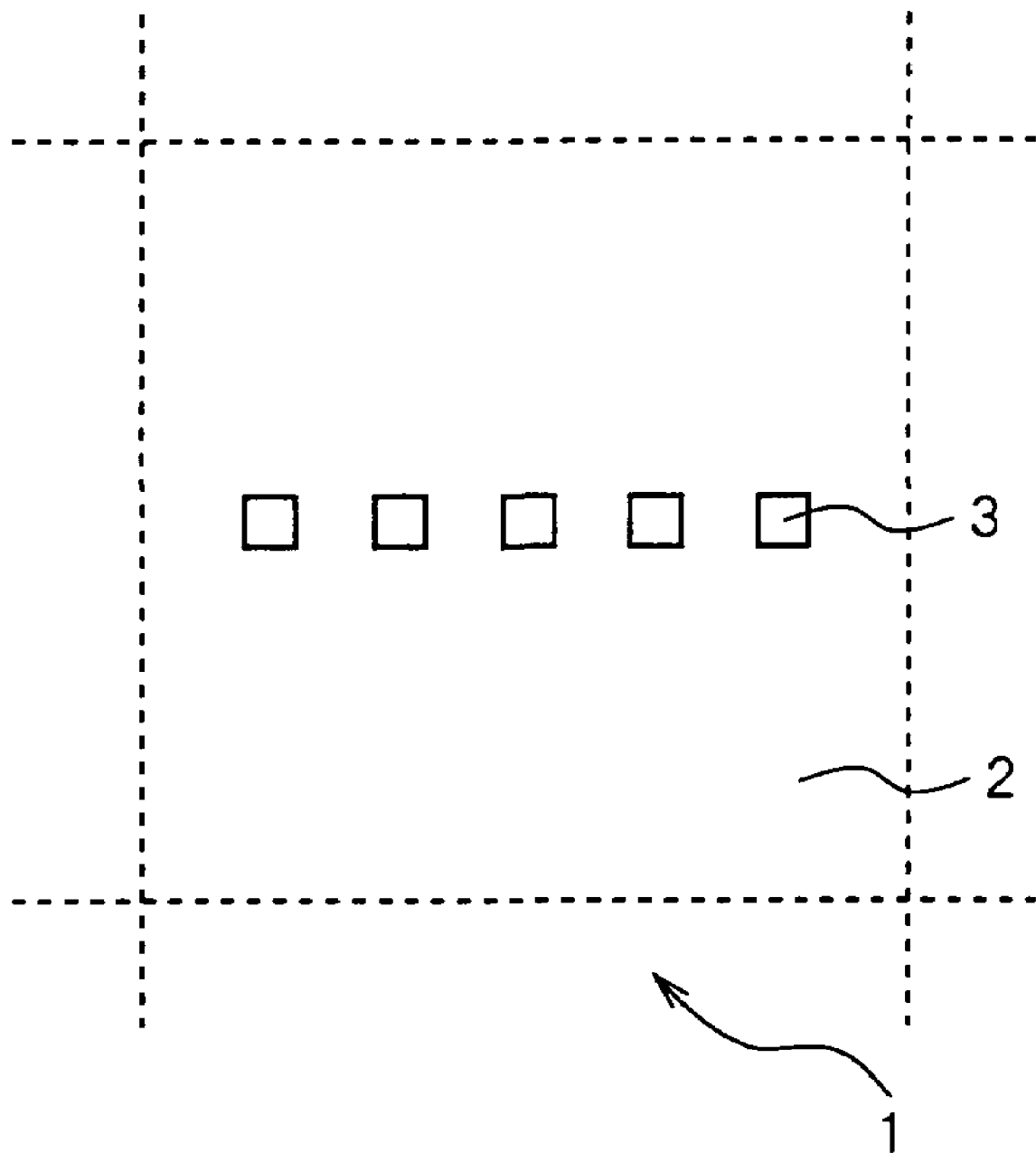
FIG. 2 is a diagram showing an outline of a memory chip formed on a semiconductor wafer.

FIG. 2 is a diagram showing an outline of the memory chip 1 formed on the semiconductor wafer 2. As shown in FIG. 2, the memory chip 1 is configured by including the semiconductor wafer 2 with a predetermined size and a plurality of chip pad (pad for the chip) s 3 formed on the surface of the semiconductor wafer 2. The chip pad 3 is a connecting terminal to carry out an electric connection to the substrate on which the memory chip 1 is mounted.

In a status in which a plurality of memory chips 1 have been formed on the semiconductor wafer 2 in such manner, then each of memory chips 1 is subjected to quality test (a second step). For example, to the chip pad 3 formed on each memory chip 1, a test probe is pressed to be electrically contacted for carrying out various function tests. By carrying out the quality test of each memory chip 1 for a unit of a whole the semiconductor wafer 2, in other words, by the quality test of a plurality of memory chips 1 formed on the semiconductor wafer 2 carried out at once, test efficiency is realized.

Figure 1C:
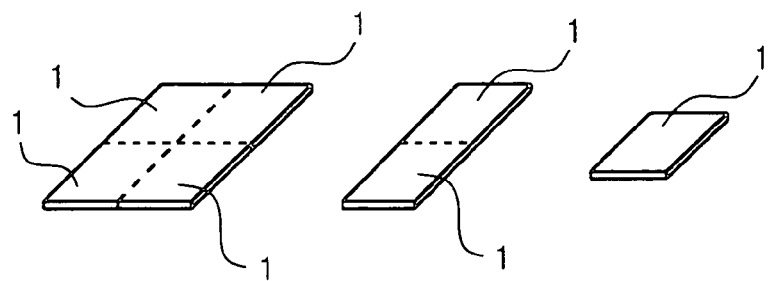

Next, on the basis of a result of the quality test in the second step, as shown in FIG. 1C, the memory chips 1 determined good are divided for the unit of a single or a plurality pieces (two or four pieces) (a third step).

Figure 3A:
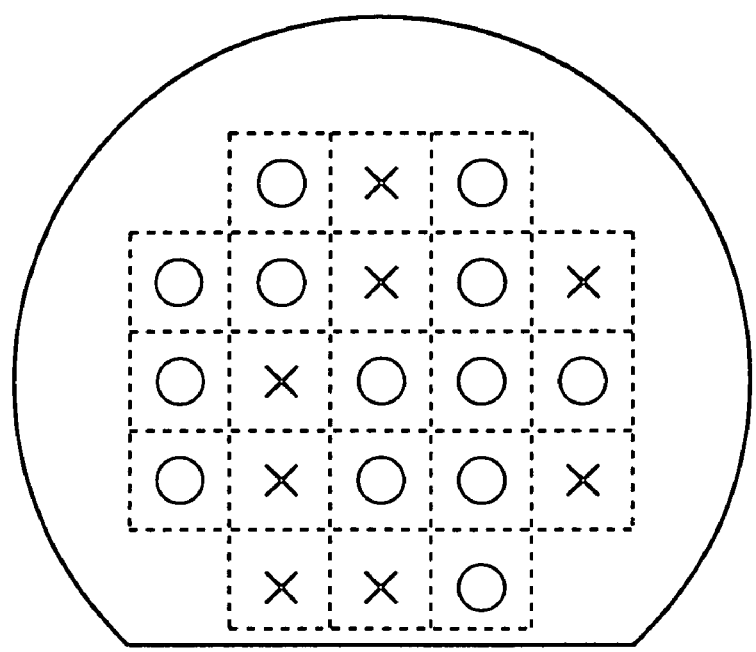
FIGS. 3A and 3B are diagrams showing an example of dividing method for the memory chip formed on the semiconductor wafer.
Figure 3B:
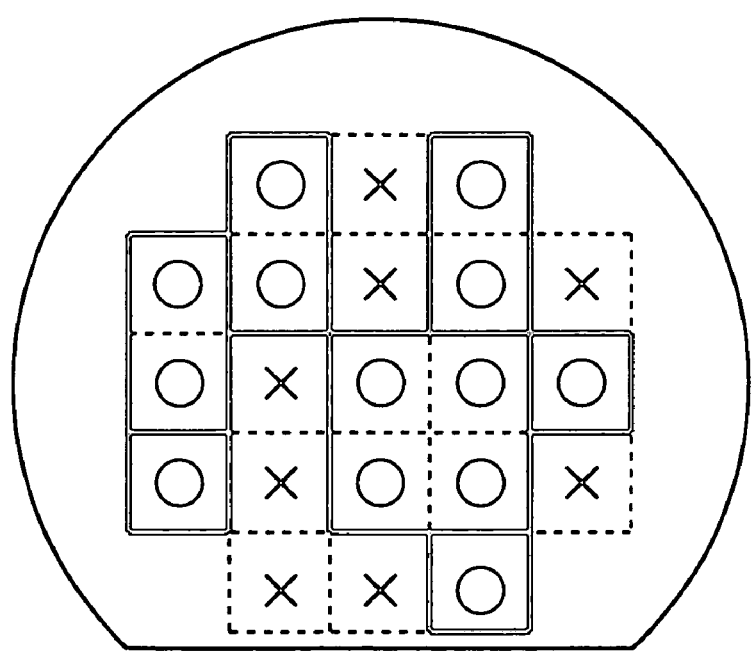

FIGS. 3A and 3B are diagrams showing an example of dividing method for a plurality of memory chips 1 formed on the semiconductor wafer 2. FIG. 3A is a diagram showing the result of the quality test of each memory chip 1 in the second step as described above. Circled and crossing marks denote memory chips 1 determined good and memory chips 1 determined bad, respectively. FIG. 3B is a diagram showing how to divide memory chips 1 determined good in FIG. 3A. An area surrounded by a solid line shows a unit of dividing. As described above, the memory chips 1 are divided in a unit of a group made of one or a plurality pieces (2 or 4 pieces). Preferably, dividing is carried out for a group made of pieces as many as possible. Therefore, the process according to the dividing method shown in FIG. 3B, four pieces are divided in the case where four memory chips 1 can be divided as a unit, two pieces are divided as a unit in the case where four memory chips 1 cannot be divided, and only one chip is divided in the case where two memory chips 1 cannot be divided. In the case where this method for dividing is applied to the result of quality test shown in FIG. 3A, as shown in FIG. 3B, 1 set produced by dividing for four memory chips 1 as a unit is taken out, 3 sets produced by dividing for two memory chips 1 as a unit is taken out, and 3 sets produced by dividing for one memory chips 1 is taken out. According to such manner, the semiconductor device comprising one or a plurality of memory chips is fabricated.

Figure 1D:
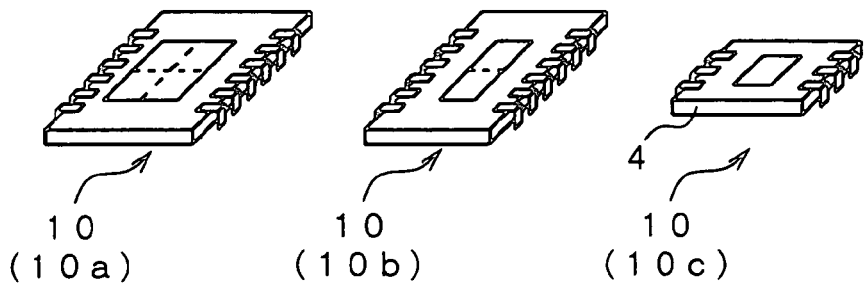

Next, as shown in FIG. 1D, the memory chips 1 which are divided are mounted on the substrate 4 to complete finally a memory module 10a made by getting four pieces of the memory chips 1 as one unit, memory module 10b made by getting two pieces of the memory chips 1 as one unit, or memory module 10c made by getting one pieces of the memory chips 1 (a fourth step). For example, as a method of mounting on the substrate 4, the chip pad 3, which is formed on the memory chip 1, is connected to an electrode (not illustrated) formed on the substrate 4 by using a bonding wire.

When bit configuration of respective memory chips 1 is 16 M×4 bits, for example, the memory module 10a containing four memory chips 1 can be used as memory device of any one of 16 M×16 bits, 32 M×8 bits, and 64 M×4 bits according to wiring manner on the substrate (not illustrated) on which the memory module 10a is implemented. In addition, the memory module 10a can be handled as same as a single memory device. Therefore, processes of implementing on other substrates can be simplified.

Similarly, when bit configuration of respective memory chips 1 is 16 M×4 bits, the memory module 10b containing two memory chips 1 can be used as memory device of any one of 16 M×8 bits and 32 M×4 bits according to wiring manner on the substrate on which the memory module 10b is implemented. In addition, the memory module 10b can be handled as same as a single memory device. Therefore, processes of implementing on other substrates can be simplified and parts can be miniaturized.

As described above, manufacture of the memory module 10 is carried out by forming a plurality of identical memory chips on the semiconductor wafer 2 and dividing the memory chips 1 judged to be nondefective by quality test. Therefore, a defect part of memory chips 1 does not cause defect product of overall memory module 10 to allow reducing the defect rate in manufacture of the memory module 10.

Quality test of a plurality of memory chips 1, which is implemented on the semiconductor wafer 2, is simultaneously carried out in a unit of overall semiconductor wafer 2 as a single group. Therefore test efficiency can be improved. Furthermore, memory chips are divided in a unit of a group made of one or a plurality of pieces (two or four pieces). Preferably, dividing is simultaneously carried out for a group made of pieces as many as possible. Namely, dividing for four pieces as a group as possible allows efficient manufacture of the memory module 10a for four pieces as a group.

Furthermore, the memory module 10a and the memory module 10b are mounted by the divided group of a plurality of memory chips 1 formed on the semiconductor wafer 2. In other words, a plurality of memory chips 1 are mounted in the status of connecting each other. Therefore, in comparison with the case where an individual memory chip 1 is divided from the semiconductor wafer 2 one by one to mount with a distance from each other memory chip 1 resulting in formation of the memory module, miniaturization of components can be realized by high density mounting. Also, mounting of a plurality of semiconductor chips 1 at once can be carried out and thus, fabrication process can be simplified.

Next, the memory module of a second embodiment by an application of the present invention will be subsequently described. The memory module according to the present embodiment is fabricated by a chip size package mounting technique (CSP). FIGS. 4A to 4D are diagrams showing the fabrication procedure of the memory module according to the present embodiment.

Figure 4A:
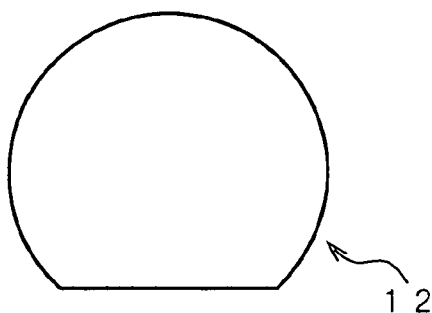
FIGS. 4A to 4D are diagrams showing the manufacturing process of the memory module of a second embodiment.
Figure 4B:
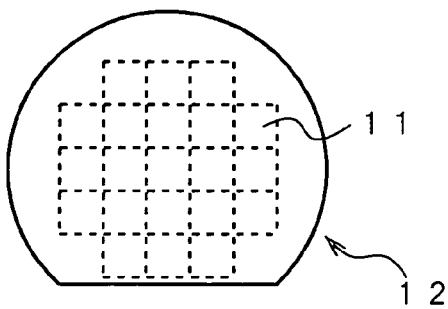
Figure 4C:
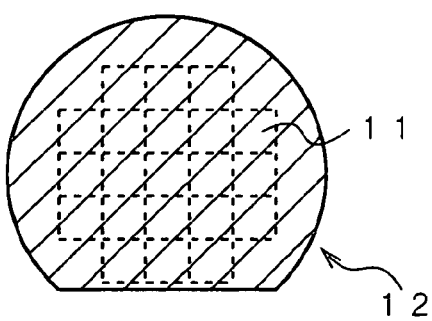

First, as shown in FIGS. 4A and 4B, the semiconductor wafer 12 is introduced to form identical memory chips 11 on this semiconductor wafer 12 (the first step). A plurality of respective regions surrounded with a dotted line in FIG. 4B show a single unit (the minimum unit of dividing) of the memory chip 11 after CSP mounting. Next, for a whole of the semiconductor wafer 12 in the status of forming a plurality of memory chips 11, as shown in FIG. 4C, after conducting wiring and resin sealing, CSP mounting is carried out to form the terminal (the second step).

Figure 5:
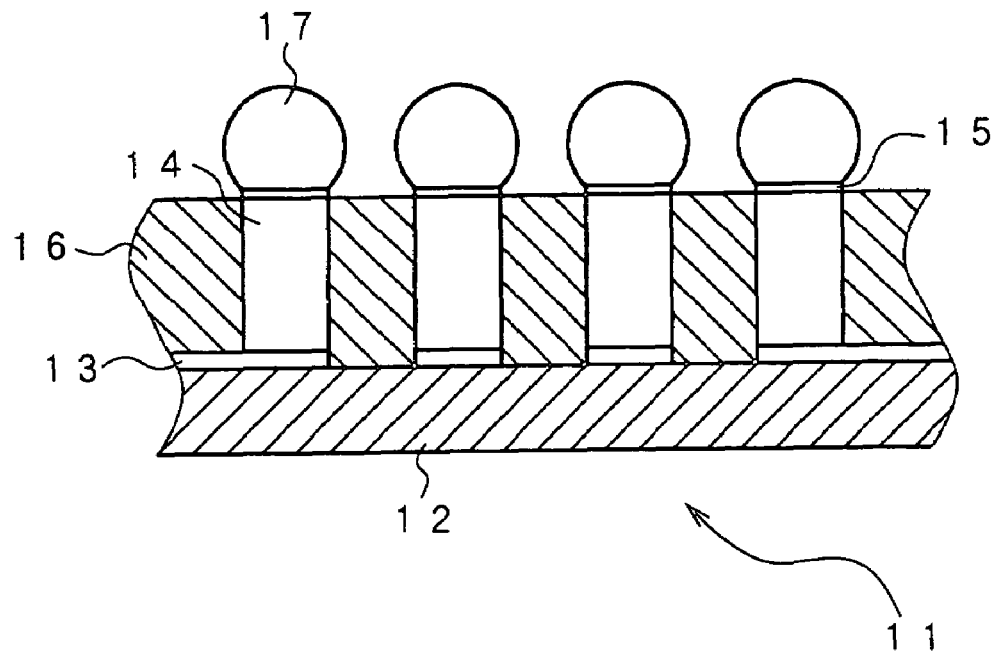
FIG. 5 is an enlarged sectional view of the memory chip mounted by CSP.

FIG. 5 is an enlarged sectional view of the memory chip 11 mounted by CSP. As shown in FIG. 5, the memory chip 11 mounted by CSP is configured by including the semiconductor wafer 12, a wiring pattern 13, a via post 14, barrier metal 15, a resin layer 16, and a solder ball 17.

The wiring pattern 13 is formed by processing a metal thin film, which has been formed on a surface of the semiconductor wafer 12, by using a resist followed by electrolytic plating processing. The via post 14 is connected to the wiring pattern 13 and the barrier metal 15 is formed on top thereof. The resin layer 16 seals the surface of the semiconductor wafer 12. The resin layer 16 has a thickness almost equal to a height of the via post 14 and is formed to allow the barrier metal 15 to expose to outside in resin sealing. The solder ball 17 is a connection terminal to electrically connect the substrate for mounting of the memory chip 11.

In the status in which according to such a manner, a plurality of memory chips 11 formed on the semiconductor wafer 12 have been mounted by CSP, then quality test is conducted for respective memory chips 11 (the third step). For example, by pressing a test probe to the solder ball 17 formed corresponding to respective memory chips 11 to electrically contact, various function tests are conducted.

Quality test of the memory chip 11 is conducted for whole semiconductor wafer 12 as a unit, in other words, quality test of a plurality of memory chips 11 formed on the semiconductor wafer 12 is conducted at once and hence, efficiency of the test is improved.

Figure 4D:
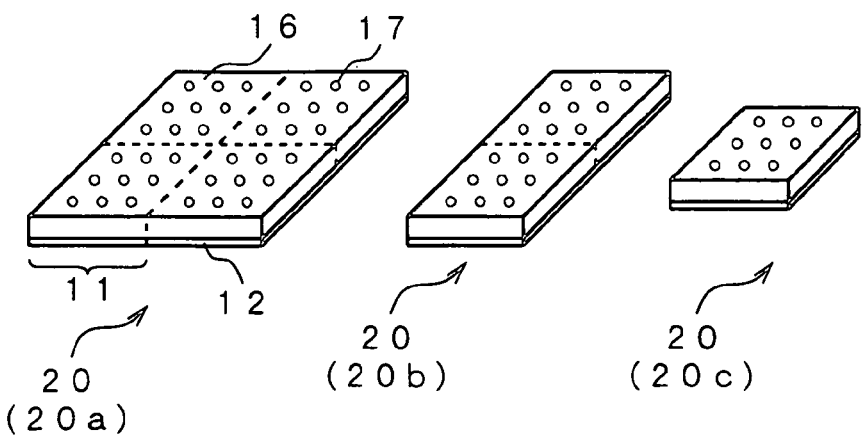

Subsequently, on the basis of a result of quality test in the third step, as shown in FIG. 4D, memory chips 11, which have been mounted by CSP and determined as good, are divided in the unit of one or a plurality (two or four pieces) of semiconductor chips and then, finally, either the memory module 20a having four memory chips 11 divided, the memory module 20b having two memory chips 11 divided, or the memory module 20c having one memory chip 11 divided is completed (a fourth step). Concretely, the dividing method shown in FIGS. 3A and 3B applied to the first embodiment described above is adopted.

As described above, after forming a plurality of identical memory chips 11 on the semiconductor wafer 12, the CSP mounting is carried out. Among respective memory chips 11 mounted by CSP, those only determined as good by a quality test are divided to fabricate the memory module 20 as the semiconductor device and thus, it does not take place that a part of defective memory chips 11 contained in the memory module 20 makes whole of the memory module 20 defective. Therefore, defect ratio can be reduced in fabrication of the memory module 20.

For the memory module 20a and memory module 20b, those made by dividing a plurality of memory chips 11 from the semiconductor wafer 12 in the group are mounted. Hence, in comparison with the case, where after dividing a single memory chip 11 from the semiconductor wafer 12 one by one the memory module is formed by mounting with a distance between respective memory chips 1, miniaturization of components can be realized by such high density mounting. Particularly, miniaturization of the mounting area becomes the minimum due to the CSP mounting. On the basis of quality categories, dividing is performed to produce the memory module 20a or the like including memory chips 11 as many as possible and thus, the memory module 20a or the like including many memory chips can be efficiently fabricated.

The present invention is not restricted to the above described embodiment and allows various modifications of practice in a range of scope of the present invention. For example, respective memory chips 1 included the semiconductor wafer 2 according to the above described first embodiment may connect corresponding terminals each other by a wire within respective memory chips 1. For example, a power supply terminal of respective memory chip 1 receives a common supply voltage and a clock terminal receives a common operation clock signal. In the case where respective terminals receiving the same voltage or respective terminals used for inputting the same signal are connected each other in formation of respective memory chips 1 to divide four pierces or two pieces of memory chips 1 simultaneously, it is adapted to apply the common voltage to or input the common signal in any one of four pierces or two pieces of memory chips 1. In this manner, by wiring between each other inside respective memory chips 1, the number of wires between a plurality of memory chips 1 and the substrate 4, on which these chips are mounted, can be reduced to simplify mounting procedure.

Figure 6:
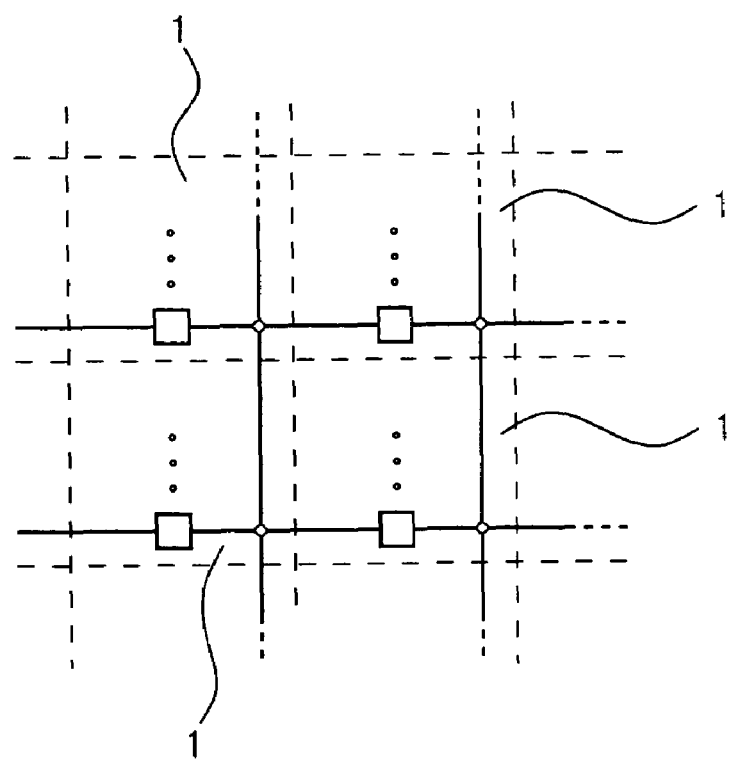
FIG. 6 is a diagram showing a connecting status between respective memory chips connected each other.

However, how to make a combination adjacent respective memory chips 1 to divide can be known until practice of quality test and therefore, as shown in FIG. 6, it is preferable to wire same terminals of all the adjacent memory chips 1 each other. In addition, the case, where the power supply terminals or the clock terminals are connected each other, has been described as an example. However, other terminals, for example, address terminals or data terminals may be connected each other. When same address terminals are connected each other, if a bit structure of one memory chip 1, for example, is 16 M×4 bits, in the memory module 10b made by dividing simultaneously two memory chips 1, the bit structure of 16 M×8 bits can be easily realized by using fewer numbers of the wire. In the memory module 10a made by dividing simultaneously four memory chips 1, the bit structure of 16 M×16 bits can be easily realized by using fewer numbers of the wire. On the other hand, when same data terminals are connected each other, if a bit structure of one memory chip 1, for example, is 16 M×4 bits, in the memory module 10b made by dividing simultaneously two memory chips 1, the bit structure of 32 M×4 bits can be easily realized by using fewer numbers of the wire. In the memory module 10a made by dividing simultaneously four memory chips 1, the bit structure of 64 M×4 bits can be easily realized by using fewer numbers of the wire.

Similarly, corresponding terminals of memory chips 11 contained in the semiconductor wafer 12 according to the above described second embodiment may be connected each other by wiring. However, in this case, other than the case where, in the semiconductor wafer 12 terminals of respective memory chips 11 are connected each other, it may be adapted to connect terminals of respective memory chips 11 each other by using the wire (the wiring pattern 13 shown in FIG. 5) formed in CSP mounting.

The bit configuration of respective the memory chip 1 is assumed 16 M×4 bits in the embodiment described above, other bit configuration is possible. Besides, a combination of different bit configurations or memory chips 1 with different capacities is possible. In the embodiment described above, the case described is of an example in that the memory chip is used for the semiconductor chip to manufacture the memory module as the semiconductor device. This example can be applied to the case where the semiconductor chip of various chips other than the memory chip, for example, a processor chip and ASIC, is used for manufacturing the semiconductor device.

In the above described first embodiment, the memory module 10 is formed by mounting a plurality of or one memory chip 1, which is made by dividing, on the substrate 4. However, it may be adapted to directly mount the memory chip 1 on a mother board of a personal computer.

INDUSTRIAL APPLICABILITY

As described above, according to the present invention, the unit of one or a plurality of semiconductor chips is divided from the semiconductor wafer according to the result of quality test. Therefore, when the semiconductor device, which comprises a plurality of semiconductor chips and is capable of high density mounting, is fabricated, the following accident does not occur: the whole of the semiconductor device becomes defective caused by defect of a part of semiconductor chips among them and thus, defect ratio can be reduced in fabricating the semiconductor device. Furthermore, the semiconductor device comprising a plurality of semiconductor chips can be used in a post-step and therefore, in comparison with the case where a plurality of semiconductor devices comprising a single semiconductor chip, the post-step can be simplified.

What is claimed is:

1. A method for manufacturing the semiconductor device, comprising:
    a first step of forming a plurality of identical semiconductor chips on a semiconductor wafer;
    a second step of carrying out a quality test for each of a plurality of said semiconductor chips formed on said semiconductor wafer; and
    a third step of dividing one of a plurality of pieces of said semiconductor chips on the basis of a result of said quality test,
    wherein said plurality of semiconductor chips are divided into first groups made of four pieces if four pieces are determined to be possible to form a group as a result of said step of carrying out a quality test, but wherein said chips are divided into second groups made of two pieces if four pieces are determined to be not possible to form a group as a result of said step of carrying out a quality test but if two pieces are determined to be possible, and wherein said chips are divided into third groups made of one piece if neither four pieces nor two pieces are determined to be possible to form a group as a result of said step of carrying out a quality test but if one piece is determined to be possible as a result of said quality test.

2. The method for manufacturing the semiconductor device according to claim 1, wherein said semiconductor chips are memory chips.

3. A method for manufacturing the semiconductor device, comprising:
    a first step of forming a plurality of identical semiconductor ships on a semiconductor wafer;
    a second step of carrying out wiring, resin sealing, terminal formation for a plurality of said semiconductor chips formed on said semiconductor wafer;
    a third stop of carrying out a quality test of each of a plurality of said semiconductor chips, which is formed on said semiconductor wafer, by using said terminal formed by said second step; and
    a fourth step of dividing one or a plurality of said semiconductor chips on the basis of a result of said quality test,
    wherein said plurality of semiconductor chips are divided into first groups made of four pieces if four pieces are determined to be possible to form a group as a result of said step of carrying out a quality test, but wherein said chips are divided into second groups made of two pieces if four pieces are determined to be not possible to form a group as a result of said step of carrying out a quality test but if two pieces are determined to be possible, and wherein said chips are divided into third groups made of one piece if neither four pieces nor two pieces are determined to be possible to form a group as a result of said step of carrying out a quality test but if one piece is determined to be possible, after said quality test is carried out.

4. The method for manufacturing the semiconductor device according to claim 3, wherein said semiconductor chips are memory chips.

* * * * *